United States Patent
Tuttle et al.

(10) Patent No.: US 6,906,396 B2
(45) Date of Patent: Jun. 14, 2005

(54) MAGNETIC SHIELD FOR INTEGRATED CIRCUIT PACKAGING

(75) Inventors: Mark E. Tuttle, Boise, ID (US); James G. Deak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 301 days.

(21) Appl. No.: 10/050,339

(22) Filed: Jan. 15, 2002

(65) Prior Publication Data

US 2003/0132494 A1 Jul. 17, 2003

(51) Int. Cl.$^7$ .......................................... H01L 31/0203
(52) U.S. Cl. ...................... 257/433; 257/659; 257/660; 257/704; 257/710; 257/729; 257/921; 438/3
(58) Field of Search ............................... 257/659, 678, 257/698, 704, 710, 778; 438/3, 108, 118; 361/749

(56) References Cited

U.S. PATENT DOCUMENTS

| | | |
|---|---|---|
| 4,953,002 A | 8/1990 | Nelson et al. |
| 5,387,551 A | 2/1995 | Mizoguchi et al. |
| 5,406,117 A | 4/1995 | Dlugokecki et al. |
| 5,561,265 A | 10/1996 | Livshits et al. |
| 5,635,754 A | 6/1997 | Strobel et al. |
| 5,640,047 A | 6/1997 | Nakashima |
| 5,650,659 A | 7/1997 | Mostafazadeh et al. |
| 5,736,070 A | 4/1998 | Murakami et al. |
| 5,751,553 A * | 5/1998 | Clayton ...................... 361/749 |
| 5,763,824 A | 6/1998 | King et al. |
| 5,825,042 A | 10/1998 | Strobel et al. |
| 5,831,331 A | 11/1998 | Lee |
| 5,866,942 A * | 2/1999 | Suzuki et al. ................ 257/698 |
| 5,889,316 A | 3/1999 | Strobel et al. |
| 5,902,690 A | 5/1999 | Tracy et al. |
| 5,939,772 A * | 8/1999 | Hurst et al. .................. 257/659 |
| 6,027,948 A * | 2/2000 | Jensen et al. .................... 438/3 |
| 6,097,080 A | 8/2000 | Nakanishi et al. |
| 6,515,352 B1 | 11/2000 | Taki et al. |
| 6,174,737 B1 | 1/2001 | Durlam et al. |
| 6,429,044 B1 | 8/2002 | Tuttle |

OTHER PUBLICATIONS

"Easy BGA Packaging for Intel® Flash Memory Devices: Product Overview," Intel.com, (2001), pp. 1–3.
"Overview Of Intel Packaging Technology," 1999 Packaging Databook, Ch. 1., pp. 1–2.
"Preliminary Mechanical and Shipping Media Information for Easy BGA Packages," Easy BGA Mechanical Specification, (May 2000), pp. 1–6.
"The Chip Scale Package (CSP)," 2000 Packaging Databook, Ch. 15, pp. 1–12.
Mahajan et al., "The Evolution of Microprocessor Packaging," Intel Technology Journal Q3, (2000), pp. 1–10.

* cited by examiner

Primary Examiner—David Nelms
Assistant Examiner—Mai-Huong Tran
(74) Attorney, Agent, or Firm—Knobbe, Martens, Olson & Bear, LLP

(57) ABSTRACT

Structures and methods for providing magnetic shielding for integrated circuits are disclosed. The shielding comprises a foil or sheet of magnetically permeable material applied to an outer surface of a molded (e.g., epoxy) integrated circuit package. The foil can be held in place by adhesive or by mechanical means. The thickness of the shielding can be tailored to a customer's specific needs, and can be applied after all high temperature processing, such that a degaussed shield can be provided despite use of strong magnetic fields during high temperature processing, which fields are employed to maintain pinned magnetic layers within the integrated circuit.

24 Claims, 6 Drawing Sheets

MAGNETIC SHIELD FOR INTEGRATED CIRCUIT PACKAGING

FIELD OF THE INVENTION

The present invention relates to magnetic shielding for integrated circuits and, more particularly, to magnetic shielding for integrated circuits having magnetic materials used therein for which protection from stray external magnetic fields is desired.

BACKGROUND OF THE INVENTION

Magnetic materials are used, for example, in magnetic cell memories and magnetic field sensors. In random access magnetoresistive memories, data is stored by applying magnetic fields and thereby causing a magnetic material in a cell to be magnetized into either of two possible memory states. The information stored in the memory is contained in the orientations of the magnetization vectors of the magnetic material layers used in each memory cell. Such memory cells exhibit a pronounced decrease in electrical resistance when an applied magnetic field brings the magnetization vectors in different layers into alignment. Recalling data is accomplished by sensing resistance changes in the cell. The cells can be written or erased by applying magnetic fields created by passing currents through conducting lines external to the magnetic structures, or through the magnetic structures themselves.

There are often undesirable magnetic fields in and about the device, which are generated either as part of the device operation or from external sources. Such fields can have significant effects on the magnetization of the magnetic thin film. The field can contribute to a loss of information or to storage of erroneous information in the magnetic memory cells. Thus, magnetic memory cells function best when they are protected from external magnetic field disturbances.

A metal with a relatively high magnetic permeability can be used to form a shield for protection from magnetic fields. Metals that are used widely in magnetic shielding include soft magnetic or high permeability materials, such as NiFe, NiFeMo and NiFeCu. Such magnetic shielding materials, are generally available from metal supply companies, such as Carpenter Technology Corporation of Wyomissing, Pa.

U.S. Pat. No. 5,939,772 entitled "Shielded Package For Magnetic Devices," issued Aug. 17, 1999, describes the use of magnetically permeable metal shields attached to the outside of a hermetically sealed ceramic package. The shields are electrically connected to the package ground plane. Laminated magnetic shielding for ceramic packages is also described in U.S. Pat. No. 5,561,265, issued Oct. 1, 1996.

Ceramic package technology can be expensive. Furthermore, as performance increases, the physical characteristics of ceramic packages may become limiting. Specifically, a ceramic material based on $Al_2O_3$ has a relatively high dielectric constant ($\epsilon_r \sim 7-8$). Additionally, because of the high-temperature processing, metallization is limited to refractory metals that are quite resistive, such as Mo and W.

Other references include application of magnetic shielding within a plastic package. U.S. Pat. No. 4,953,002, issued Aug. 28, 1990, for example, teaches magnetic shielding internal to a plastic encapsulated package.

Magnetic integrated circuit structures must also be housed in a way that minimizes cost if they are to be viable for the commercial memory market. Therefore, a shielding arrangement to protect magnetic films in magnetic integrated circuit structures from significant external adverse influences, including external magnetic fields, and which can be provided economically, would be desirable. Desirably, such a shielding arrangement should be flexible enough to meet the varied needs of integrated circuit users.

SUMMARY OF THE INVENTION

In accordance with one aspect of the invention, a housing is provided for protecting an integrated circuit device. The housing comprises a molded body that encapsulates the integrated circuit device. At least one magnetically permeable foil is applied to an outer surface of the molded body.

In accordance with another aspect of the invention, a method is provided for magnetically shielding a semiconductor die. The method includes forming a molded housing around the semiconductor die. A film of magnetic shield material is applied to at least one outer surface of the molded housing. The film is applied in a manner that such that it is approximately parallel to a major surface of the semiconductor die. Advantageously, the shield material can be degaussed just prior to application, after the package is subjected to high temperature processing.

In accordance with another aspect of the invention, an integrated circuit package is provided. The package includes an integrated circuit die, a molded body encapsulating the die, and a magnetic shield layer extending parallel to a major surface of the die over an outer surface of the molded body.

In accordance with still another aspect of the present invention, a method is provided for packaging an integrated circuit chip. The method includes mounting the chip on a die carrier. Epoxy is molded over the chip to form an encapsulant. A magnetic shield layer is then selected for a particular integrated circuit environment. This selected magnetic shield is applied over the encapsulant.

In accordance with still another aspect of the invention, an integrated circuit package is provided with an encapsulant surrounding an integrated circuit die. The encapsulant includes a recess on an outer surface thereof. The recess is configured for receiving and mechanically retaining a magnetic shield foil. In the illustrated embodiment, the recess includes overhanging tabs for removably trapping the foil within the recess.

DETAILED DESCRIPTION OF THE PREFERRED EMBODIMENT

Figure 1:
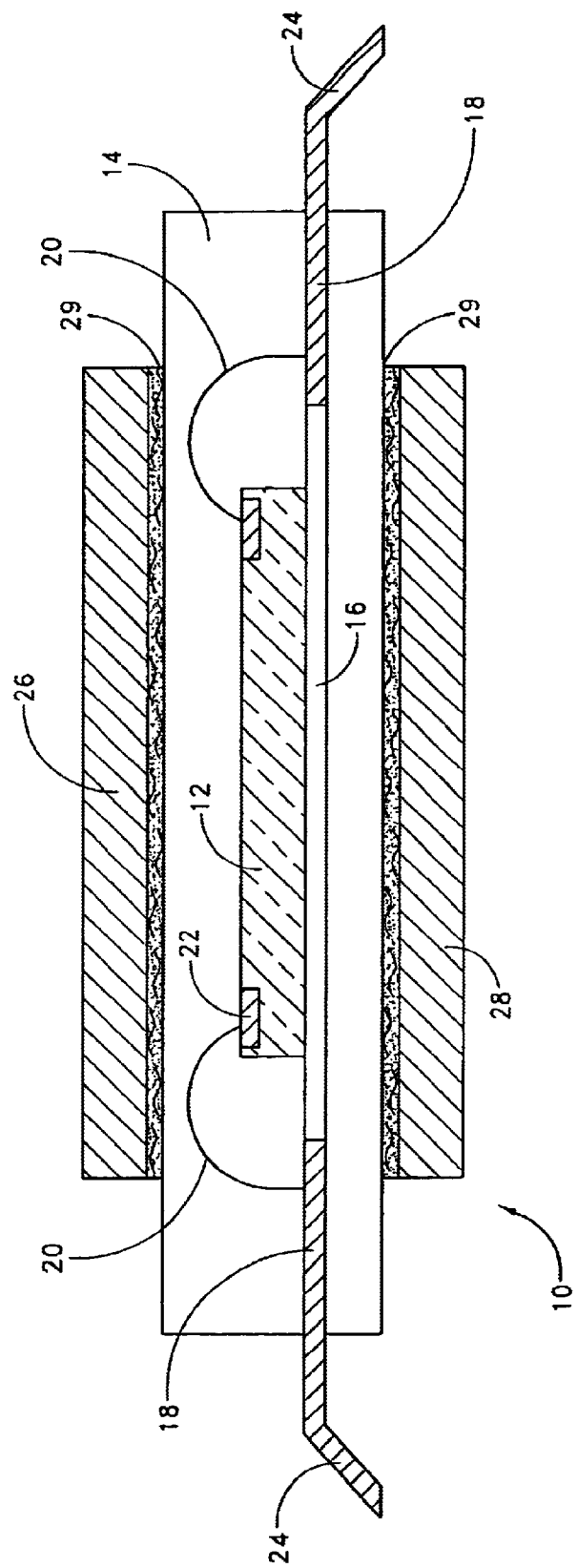
FIG. 1 is a schematic cross section of a packaged integrated circuit with magnetic shielding attached to outer surfaces of the package, according to an illustrated embodiment of the invention.

Magnetic integrated circuits, such as MRAM (magnetic random access memory) devices, can be sensitive to external magnetic fields. Information is stored in MRAMs specifically as a direction of magnetization in a magnetic material layer. If the layer is exposed to an undesirable external magnetic field, the direction of magnetization can inadvertently change. Such exposure to stray fields can lead to memory erasure, accidental writing and/or reading errors.

Of course, the external environments for magnetic integrated circuit devices are not all the same. Some devices may be located in environments with strong external magnetic fields, and some may be located in environments where external magnetic fields are negligible. When magnetic shielding is incorporated inside the packaging of a magnetic device, a best guess is made as to the size and thickness of magnetic shielding to use. There are drawbacks to this "one size fits all" approach. The designer may choose to provide magnetic shielding for a worst-case scenario, thereby using more magnetic material than may be required for many applications. In this case, customers pay for more shielding than they might need. Additionally, customers may wish to have shielding for only some of their applications.

Perhaps more importantly, magnetic shielding should be degaussed, i.e., provided with random magnetic orientation. In order to keep the shield degaussed, the shield should be applied as late as possible in the packaging process. This is because during any high temperature steps, the chip must be exposed to a controlled magnetic field to ensure that the "pinned" or fixed magnetic layers within the chip maintain their desired magnetic alignment. Even soldering a package to a circuit board can raise temperatures high enough to risk alteration of the pinned layers' magnetization. Thus, even packaging steps should be performed under a controlled magnetic field, if possible. Unfortunately, such a field would also tend to align the magnetic shield, if present, such that it would not remain degaussed.

It would be useful to have a system of magnetic shielding for magnetic integrated circuits that can be adapted easily for individual customer applications, is removable for certain applications and/or can be readily applied after all high temperature processing, particularly those steps in which magnetic fields are applied to maintain pinned layers within the chip.

The aforementioned needs are satisfied by the embodiments of the present invention, which provide package structures and methods for providing magnetic shielding to an integrated circuit after packaging is complete. Thus, the magnetic shielding can be tailored to meet the specific needs of the customer without incurring the expense of over-shielding or the risk of under-shielding. More importantly, the shield can be degaussed and applied after all high temperature packaging steps. Furthermore, in certain embodiments described herein, magnetic shielding is removably applied to an outside surface of an integrated circuit package, such that it can be removed and degaussed after packaging and even after mounting the package without degaussing pinned layers in the chip.

These and other objects and advantages of the present invention will become more fully apparent from the following description taken in conjunction with the accompanying drawings.

FIG. 1 is a cross-sectional, schematic drawing of a package or housing 10 for an integrated circuit device, according to an illustrated embodiment of the invention. The package comprises a magnetic integrated circuit 12 encapsulated within a plastic or epoxy encapsulant, preferably in the form of a molded body 14. For purposes of the present description a magnetic integrated circuit is defined as an integrated circuit containing at least one magnetic thin film layer forming a part of an active device. Preferably, the molded body 14 comprises an organic material, more preferably, an elastomer or an epoxy mold compound. The skilled artisan will appreciate that the molded body 14 encapsulates the die 12, in contrast to ceramic packages that are hermetically sealed around a die.

The integrated circuit 12 is encapsulated onto a die carrier or substrate 16. Preferably, the die carrier 16 comprises electrically conducting leads 18. Conducting wires 20 are bonded to bond pads 22 on the integrated circuit 12 and attached to the electrically conducting leads 18 of the die carrier 16. In an alternative "flip chip" arrangement (not shown), solder bumps on the integrated circuit are bonded to the leads 18, and conducting wires 20 are not used. In the illustrated embodiment, the leads 18 extend into electrodes 24 that protrude from the molded body 14 and can make connections to external circuitry. The electrodes 24 typically extend below the molded body 14.

As will be appreciated by the skilled artisan, the features and advantages described herein will have application to numerous molded or encapsulated integrated circuit packages, such as lead frame packages. More recently, however, die carriers comprise plastic substrates. For such packages, the electrical leads 18 and electrodes 24 represent conductive traces on or in a plastic substrate extending out of the molded body 14 to form contacts that eventually form connections with larger circuits (e.g., a motherboard).

In FIG. 1, magnetically permeable foils 26, 28 are attached to both the top and bottom outer surfaces of the molded body 14. The foils 26, 28 are thus electrically insulated from the packaged circuitry and leads. Preferably, the foils comprise soft magnetic or high permeability materials, such as nickel-iron based alloys, cobalt-iron based alloys, nickel-cobalt based alloys or amorphous ferromagnetics. More preferably, the foils comprise a NiFe-based alloy, such as mu metal or permalloy. Preferably, the foil thickness is between about 1 $\mu$m and 1000 $\mu$m. The foils 26, 28 are held onto the approximately flat surfaces by thin layers of adhesive 29, preferably, an epoxy-based adhesive. The foils 26, 28 are arranged to be and larger than a major surface of the magnetic integrated circuit 12. In an alternative arrangement, there is a magnetically permeable foil 26 on only one outer surface.

Figure 2:
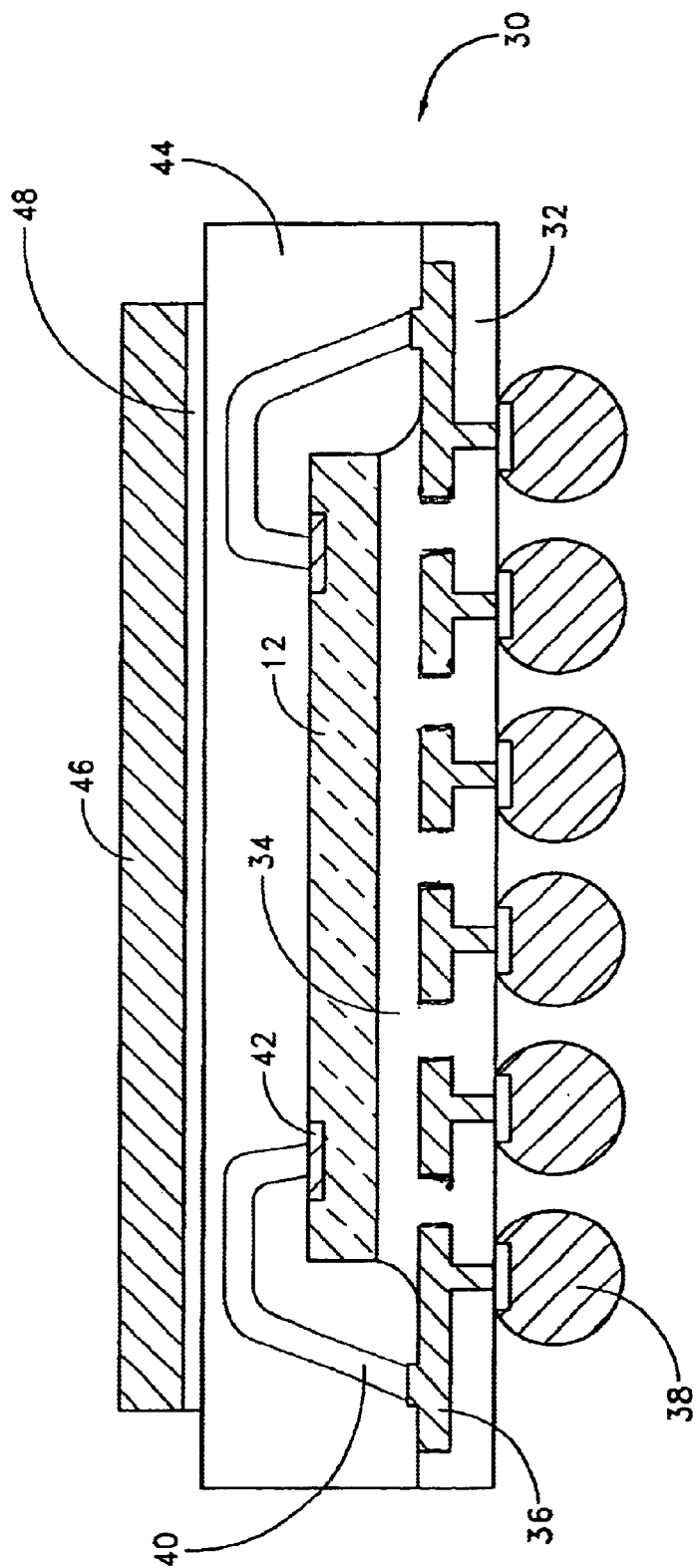
FIG. 2 is a schematic cross section of an integrated circuit encapsulated in a ball-grid array package that has magnetic shielding attached to an outer surface of the package, according to an illustrated embodiment of the invention.

FIG. 2 is a schematic cross section of a ball-grid array housing or package 30 for an integrated circuit device 12, according to another embodiment of the invention. The integrated circuit or die 12 is attached to a rigid substrate 32 with a die attach material 34, preferably epoxy or elastomer. The rigid substrate 32 contains conductive traces 36 that connect to solder balls 38 arranged in an array on the bottom surface of the rigid substrate 32. The solder balls 38 are configured to make electrical connections to external circuitry. Conductive wires 40 provide conductive paths between bond pads 42 on the integrated circuit 12 and the conductive traces 36 on the rigid substrate 32. A molded body 44 encapsulates the integrated circuit 12 onto the rigid substrate 32, with the solder balls 38 serving as the electrodes that are not covered by the molded body 44 and therefore are exposed on the outside of the package 30. Preferably, the molded body 44 comprises an organic material, more preferably, an elastomer or an epoxy mold compound.

In FIG. 2, a magnetically permeable foil 46 is attached to an outer surface of the molded body 44, held in place by a thin layer of adhesive 48, preferably, an epoxy-based adhesive. The molded body 44 electrically insulates the foil 46 from the package circuitry. Preferably, the foils comprise "soft" magnetic or high permeability materials, such as nickel-iron based alloys cobalt-iron based alloys, nickel-cobalt based alloys or amorphous ferromagnetics. More preferably, the foils comprise NiFe-based alloys such as mu metal or permalloy. Preferably, the foil thickness is between about 1 $\mu$m and 1000 $\mu$m. The foil 46 is arranged to be approximately parallel to and larger than a major surface of the magnetic integrated circuit 12.

Figure 3:
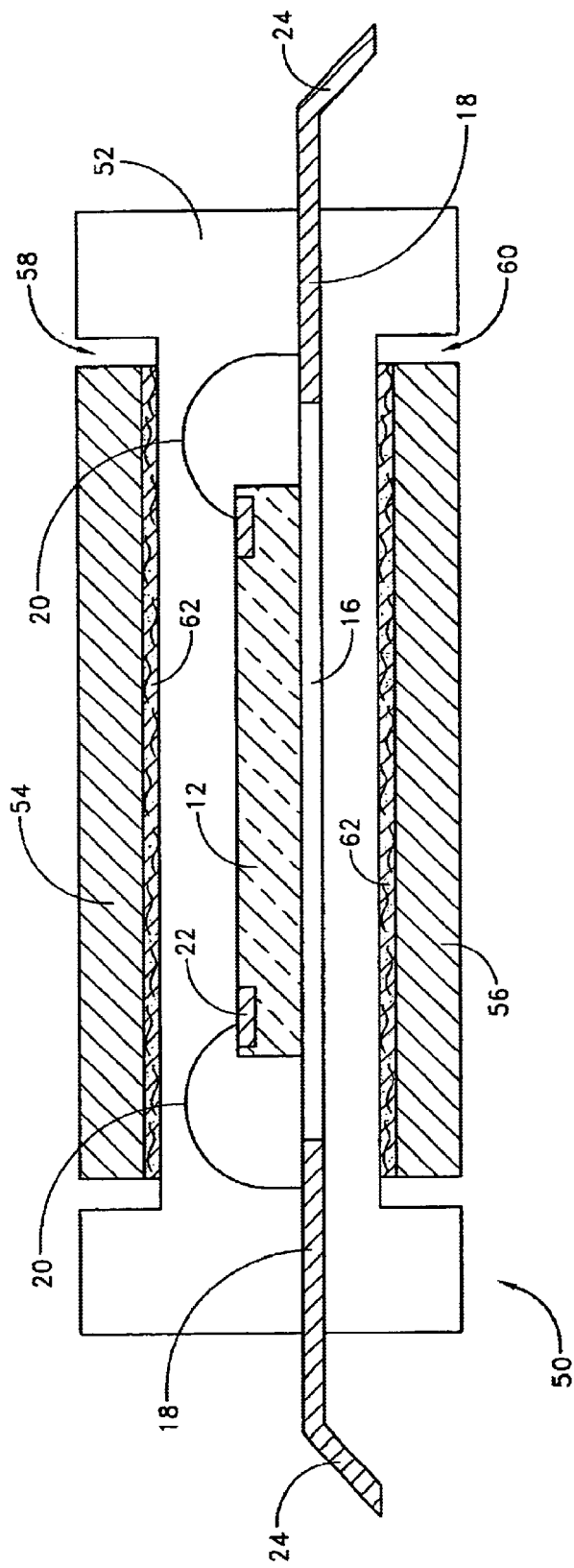
FIG. 3 is a schematic cross section of a packaged integrated circuit with magnetic shielding set into recesses on outer surfaces of the package, according to an illustrated embodiment of the invention.

FIG. 3 is a cross-sectional, schematic drawing of a housing or package 50 for an integrated circuit device 12, according to another embodiment of the invention. The package 50 comprises the magnetic integrated circuit 12 encapsulated within a molded body 52. Preferably, the molded body 52 comprises an organic material, more preferably, an elastomer or an epoxy mold compound.

As described above for FIG. 1, the integrated circuit 12 is encapsulated by the molded body 52 onto a die carrier 16. Preferably, the carrier 16 includes electrically conducting leads 18. Conducting wires 20 are bonded to bond pads 22 on the integrated circuit and attached to the electrically conducting leads of the die carrier 18, 16. In an alternative arrangement (not shown), solder bumps on the integrated circuit are bonded to electrically conducting traces on a plastic substrate in a "flip chip" arrangement, and conducting wires 20 are not used. The electrically conducting leads 18 extend to form electrodes 24 that protrude from the molded body 52 and can make connections to external circuitry. The electrodes 24 themselves can comprise the contacts of a lead frame, but more preferably comprise conductive traces on or in a plastic substrate.

In FIG. 3, magnetically permeable foils 54, 56 are fitted into recesses 58, 60 in the top and bottom outer surfaces of the molded body 52. Preferably, the foils comprise "soft" magnetic or highly permeable materials as described hereinabove. The foils 54, 56 are held in place by thin layers of adhesive 62, preferably, an epoxy-based adhesive. The foils 54, 56 are arranged to be approximately parallel to and larger than a major surface of the magnetic integrated circuit 12. In another arrangement, there is a magnetically permeable foil 54 and recess 58 on only one outer surface of the molded body 52.

In accordance with one arrangement, the recesses 58, 60 are etched into the encapsulant 52 after molding. Preferably, however, the recesses 58, 60 are formed in the body 52 as molded.

Figure 4:
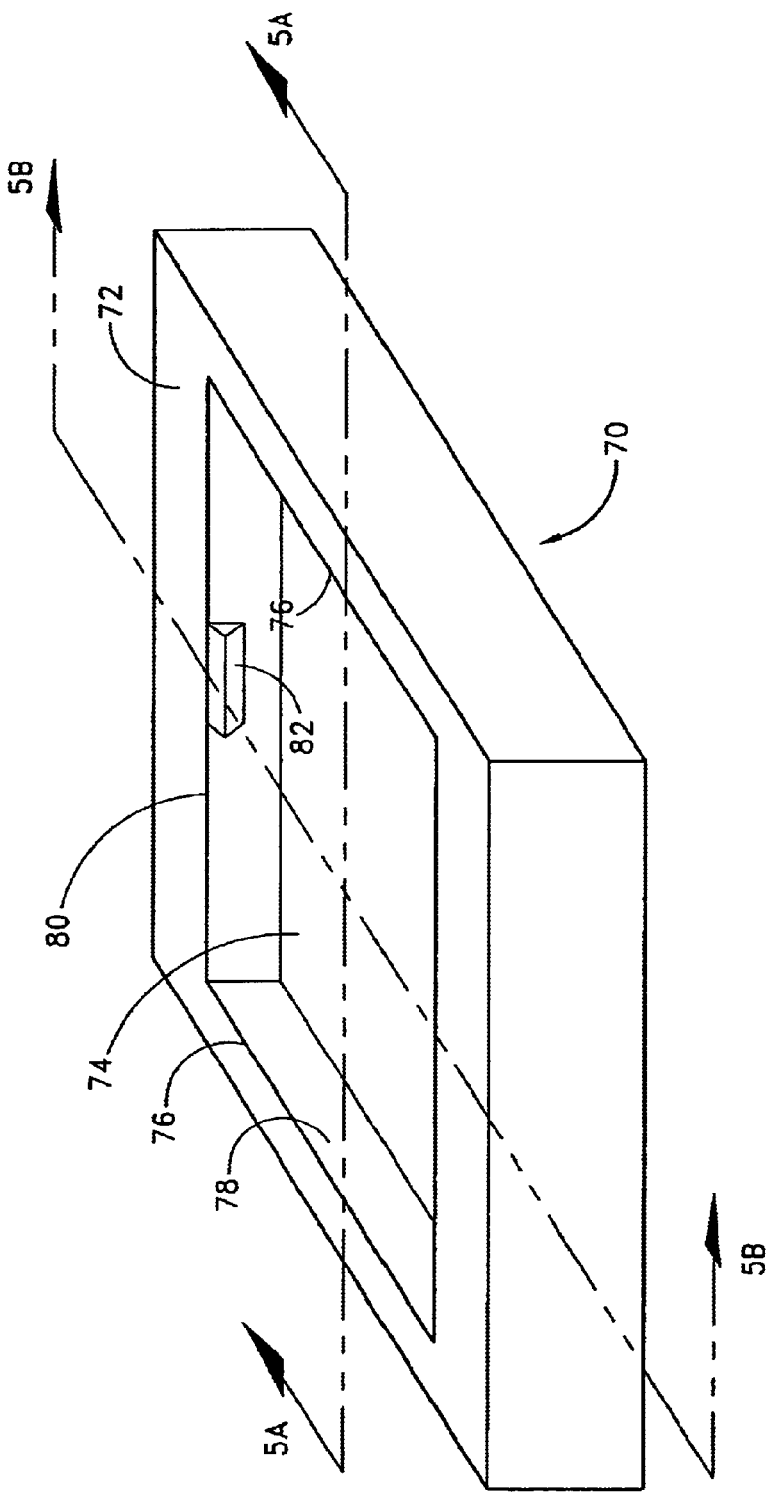
FIG. 4 is a perspective view of a ball-grid array package showing a recess in the top surface in which a magnetic shield is held mechanically, according to an illustrated embodiment of the invention.

Another preferred embodiment for attaching a magnetically permeable foil in a recess in the outer surface of a molded body can be understood with reference to FIG. 4. A finished ball-grid array type of package 70 ready for the addition of magnetic shielding is shown in a perspective view in FIG. 4. Only the molded body or encapsulant 71 is shown in FIG. 4.

The top surface 72 contains a recessed region 74 over most of its area. The recess 74 has two parallel edges 76 whose sidewalls 78 are approximately perpendicular to the top surface 72, as is apparent in the cross-sectional view of FIG. 5A. The remaining two parallel edges 80 of the recess 74 include an overhanging tab 82 at the top surface 72, which protrudes into the region of the recess 74, as is apparent from the cross-sectional view of FIG. 5B. The recess 74 is preferably formed, including overhanging tabs 82, during the molding process. One or more tabs 82 are preferred over a single overhanging ledge extending the length of the edge 80, simply to facilitate removal of the mold.

Figure 5A:
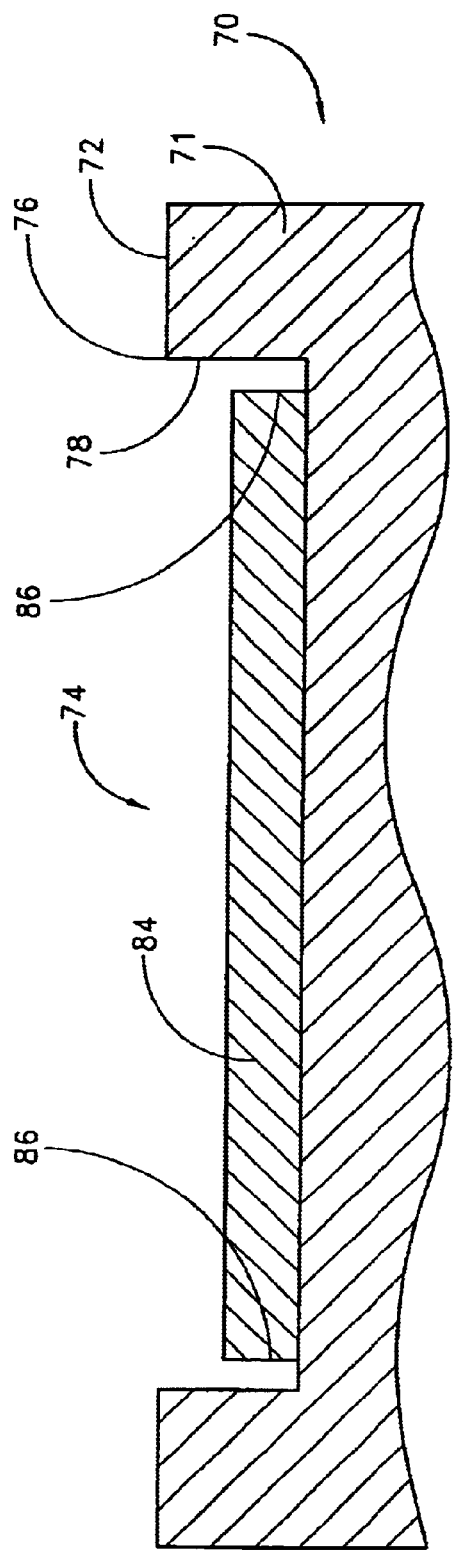
FIGS. 5A and 5B are schematic cross sections cut along lines 5A—5A and 5B—5B, respectively, of FIG. 4.
Figure 5B:
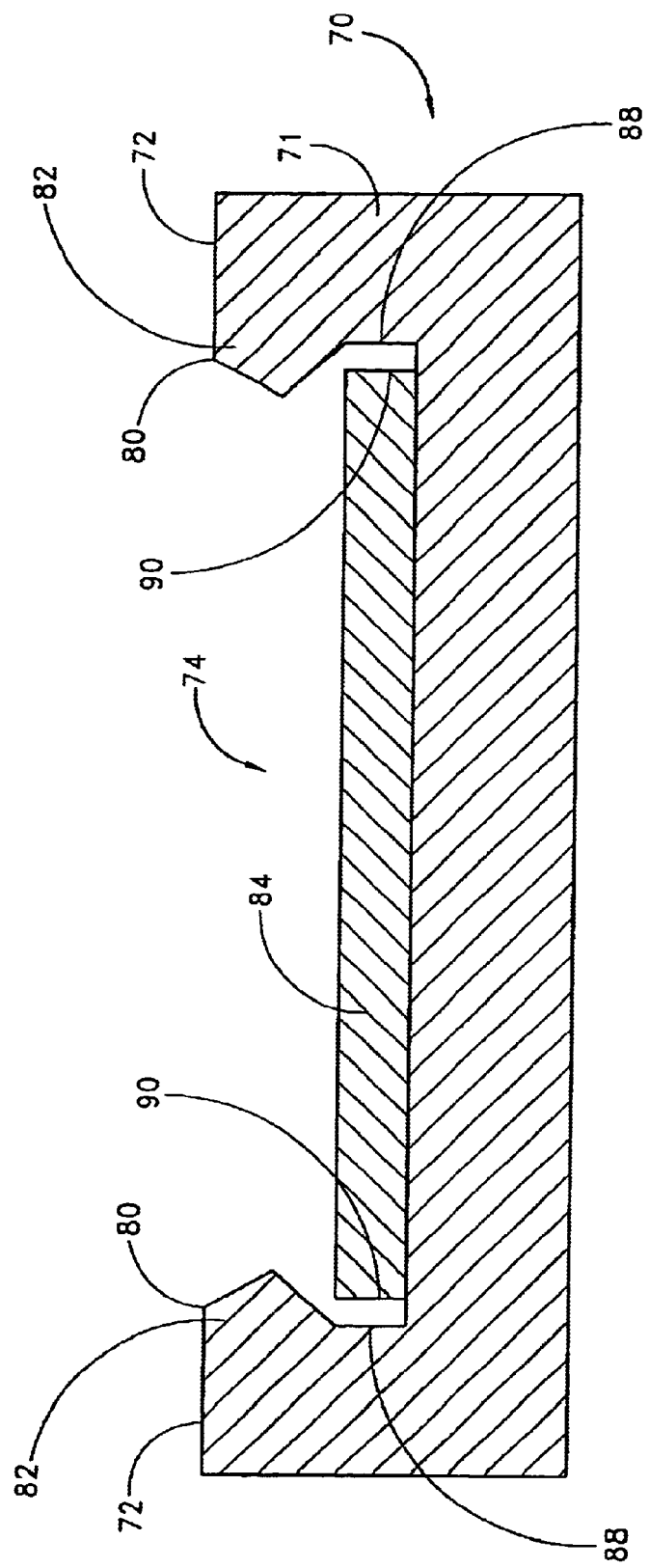

FIGS. 5A and 5B show only the top outer surface portion of a housing for an integrated circuit. It will be understood that the outer surface arrangement shown in FIGS. 5A and 5B can be used with any number of integrated circuit and wiring arrangements consistent with molded body packages, including those discussed above for FIGS. 1 and 2. Additionally, the outer surface arrangement shown in FIGS. 5A and 5B can be used either on only one package surface or on both major package surfaces, according to the requirements of the operating environment. Preferably, the molded body 71 comprises an organic material, more preferably, an elastomer or an epoxy mold compound.

FIG. 5A is a cross section of the recess 74 cut through the recess edges 76 whose sidewalls 78 are approximately perpendicular to the top surface 72 of the molded body 71. A sheet of magnetic shield material 84 lies within the recess 74 with its edges 86 adjacent to the sidewalls 78 of the recess 74.

FIG. 5B is a cross section of the recess 74 cut along a surface perpendicular to the surface shown in FIG. 5A. The top edges 80 of the recess 74 have at least one overhanging tab 82 at the top surface 72 of the housing 70 and, deeper inside the recess 74, sidewalls 88 that are approximately perpendicular to the plane of the top surface 72. The overhanging tabs 82 protrude into the region of the recess 74. A sheet of magnetic shield material 84 is trapped within the recess 74, below the tabs 82, with its edges 90 adjacent to the sidewalls 88 of the recess 74. It will be understood that, in other arrangements, the tabs 82 can taper to the recess floor rather than having the illustrated perpendicular sections 88. The illustrated tab configuration, tapering above and below the innermost protrusion, facilitates deflection to insert and/or remove the magnetic shield 84.

In the illustrated embodiment, no adhesive is used to hold the sheet of magnetic shield material 84 in place within the recess 74 of the molded body 71 for the magnetic integrated circuit. The sheet of magnetic shield material 84 is cut to fit the size of the recess 74. The sheet 84 is placed into the recess 74 by bending the sheet 84 slightly to fit under the overhangs 82 and then releasing the sheet 84 to fit into place against the sidewalls 88 of the recess 74. The width of the recess opening within the overhang edges 82 is less than the width of the magnetic material sheet 84, thus providing a mechanical means of keeping the magnetic material sheet 84 in place. It will be understood that, if desired, adhesive can additionally be employed.

Advantageously, the magnetic shield 84 can additionally be removed and replaced. Thus, a package can be shipped with the shield 84 in place. The customer can remove the shield 84, conduct additional high temperature processing in a strong magnetic field (without affecting the shield), and replace the shield after completion of high temperature packaging steps. Alternatively, after installation and use, the shield 84 can be removed for degaussing again, should the need arise.

The embodiments of the invention have been described using examples of packages that contain one integrated circuit or die. The embodiments of the invention are equally useful for a multi-die package, wherein integrated circuits are arranged next to one another and/or stacked one over another within one molded package. Connections among the dies and between the dies and conducting traces connected to electrodes that protrude from the package can be made by wire bonding or by solder bump bonding as described above with respect to the illustrated embodiments.

The structures and methods described above in the illustrated embodiments offer many advantages for magnetic shielding of magnetic integrated circuits. Fully processed and packaged integrated circuit devices can be removed from the fab environment and inventoried. At this point, all high temperature processing has been completed. Magnetic shielding, tailored to meet a particular customer's requirements, can be added to the outside of the packages just prior to shipping. The magnetic shielding is preferably degaussed and/or given a particular magnetic alignment according to customer needs. This would not be possible if the magnetic shielding were introduced into the integrated circuit or the package before all high temperature processing was complete. Moreover, the embodiments described herein obtain magnetic shielding, post-processing tailoring and the benefits of low-dielectric epoxies and high conductivity copper metallization for IC packaging.

Although the foregoing description of the preferred embodiments of the present invention has shown, described and pointed out the fundamental novel features of the invention, it will be understood that various omissions, substitutions and changes in the form of the detail of the apparatus as illustrated as well as the uses thereof may be made by those skilled in the art, without departing from the spirit of the present invention. Consequently, the scope of the present invention should not be limited to the foregoing discussion, but should be defined by the appended claims.

We claim:

1. A housing for protecting an integrated circuit device comprising:
   a molded body encapsulating the integrated circuit device; and
   at least one magnetically permeable foil applied to an outer surface of the molded body.

2. The housing of claim 1, wherein the integrated circuit device comprises at least one magnetic thin film.

3. The housing of claim 1, wherein the molded body comprises an organic material.

4. The housing of claim 3, wherein the organic material comprises an epoxy mold compound.

5. The housing of claim 1, wherein the molded body encapsulates the integrated circuit device on a plastic substrate.

6. The housing of claim 5, wherein the plastic substrate comprises a ball grid array substrate.

7. The housing of claim 5, wherein wire bonds extend between the device and electrically conductive traces on the plastic substrate.

8. The housing of claim 5, wherein solder bumps on the device are in contact with electrical traces on the plastic substrate.

9. The housing of claim 1, further comprising electrical leads protruding from the molded body.

10. The housing of claim 9, wherein the electrical leads comprise conductive traces on a plastic substrate.

11. The housing of claim 1, wherein the integrated circuit device comprises a plurality of integrated circuit dies.

12. The housing of claim 1, wherein the magnetically permeable foil applied to the outer surface of the molded body is approximately parallel to a major surface of the integrated circuit device.

13. The housing of claim 1, further comprising a layer of adhesive between the outer surface of the molded body and the at least one magnetically permeable foil.

14. The housing of claim 1, wherein at least one outer surface of the molded body comprises a recess designed to receive the magnetically permeable foil.

15. The housing of claim 14, wherein the at least one outer surface of the molded body further comprises an overhang along at least a portion of a perimeter of the recess, the overhang providing a mechanical means to hold the magnetically permeable foil within the recess.

16. The housing of claim 15, wherein the overhang comprises at least one sloped tab protruding into the recess.

17. The housing of claim 1, wherein the magnetically permeable foil is selected from the group consisting of nickel-iron based alloys, cobalt-iron based alloys, nickel-cobalt based alloys, and amorphous ferromagnetics.

18. The housing of claim 1, wherein the magnetically permeable foil has a thickness between about 1 $\mu$m and 1000 $\mu$m.

19. The housing of claim 1, wherein the magnetically permeable foil is removable.

20. An integrated circuit package, comprising:
    an integrated circuit die;
    a molded body encapsulating the die; and
    a magnetic shield layer extending over an outer surface of the molded body and parallel to a major surface of the die, the magnetic shield layer being electrically insulated from the die.

21. The integrated circuit package of claim 20, wherein the magnetic shield layer is mechanically trapped within a molded recess on an outer surface of the molded body.

22. The integrated circuit package of claim 20, wherein the magnetic shield layer is removably attached to the outer surface of the molded body.

23. An integrated circuit package comprising an encapsulant surrounding an integrated circuit die, the encapsulant including a recess on an outer surface thereof, and the recess configured for receiving and mechanically retaining a magnetic shield foil.

24. The integrated circuit package of claim 23, wherein the encapsulant comprises overhanging tabs protruding into the recess for removably trapping the foil within the recess.

* * * * *